United States Patent

Furuya

[11] Patent Number: 4,791,294
[45] Date of Patent: Dec. 13, 1988

[54] ELECTRON BEAM SCANNING METHOD AND SCANNING ELECTRON MICROSCOPE

[75] Inventor: Toshihiro Furuya, Katsuta, Japan

[73] Assignee: Hitachi, Ltd., Tokyo, Japan

[21] Appl. No.: 105,250

[22] Filed: Oct. 7, 1987

[30] Foreign Application Priority Data

Oct. 8, 1986 [JP] Japan .................................. 61-237947

[51] Int. Cl.$^4$ ........................................... H01J 37/256
[52] U.S. Cl. .............................. 250/310; 250/346 ML; 250/307
[58] Field of Search ................. 250/310, 390 ML, 307

[56] References Cited

U.S. PATENT DOCUMENTS 3,842,272  10/1974  Coates et al. ................. 250/310
4,554,452  11/1985  Suganuma ..................... 250/310

Primary Examiner—Bruce C. Anderson
Assistant Examiner—Jack I. Berman
Attorney, Agent, or Firm—Antonelli, Terry & Wands

[57] ABSTRACT

Disclosed is an electron beam scanning method and a scanning electron microscope, wherein an electron beam scans an electrical insulation sample in reciprocative directions, with a time difference of n period(s) (n=0, 1, 2, ...) plus a half period of a.c. power or external a.c. magnetic field being provided between a scanning start time point in each scanning direction of the deflection magnetic field and a corresponding zero-cross point of the a.c. power or external magnetic field so as to reduce the sample shape measurement error caused by the difference of charging on the sample, thereby enhancing the accuracy of sample shape measurement.

8 Claims, 3 Drawing Sheets

ELECTRON BEAM SCANNING METHOD AND SCANNING ELECTRON MICROSCOPE

BACKGROUND OF THE INVENTION

This invention relates to a scanning electron microscope, and particularly to an electron beam scanning method and a scanning electron microscope suitable for the observation and measurement of the shape of insulation samples.

For the observation of the shape of an electrical insulation sample with a scanning electron microscope (SEM), the electron beam acceleration voltage is desirably selected to a lower voltage, e.g., around 1000 volts, in order to reduce charges on the sample. However, when a sample of various insulation materials undergoes a sequential linear scanning with an electron beam, it has slightly different charged voltages at the starting and ending portions of scanning even if the sample is symmetric in shape with respect to the horizontal direction, resulting in a slightly asymmetric waveform of the secondary electron output signal.

Although the above-mentioned conventional method is suited to determine the approximate shape of a sample by observation, the asymmetry of the output signal waveform imposes a problem when the shape of sample is observed more accurately, a specific portion of the sample shape is recognized accurately from the waveform of secondary electron output signal, or the dimensions of a specific portion of a sample is measured.

SUMMARY OF THE INVENTION

An object of this invention is to provide an electron beam scanning method and a scanning electron microscope which alleviate the adverse effect of differential charging and allow the accurate observation and measurement of the shape of electrical insulation samples.

The present invention features the scanning manner in which a sample having electrical characteristics approximating those of an insulator is scanned with an electron beam in two directions alternately so that a time difference of n periods plus a half period (n=0, 1, 2, ...) is created between the time point of scanning commencement in each direction and the time point of corresponding zero-cross point of a.c. power or external a.c. magnetic field. This scanning scheme makes a unique magnitude of deflection magnetic field at the same phase of each period, whereby the electron beam scanning position on the sample is made invariable over scanning cycles. Consequently, the adverse effect of differential charging can be prevented.

DESCRIPTION OF THE PREFERRED EMBODIMENTS

Embodiments of the present invention will now be described with reference to the drawings.

Figure 1:
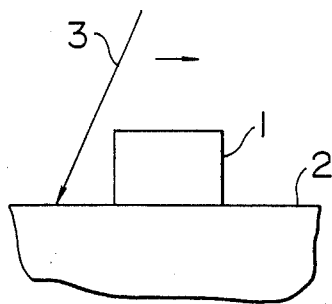
FIG. 1 is a side view showing the electron beam scanning on an electrical insulation sample.

In FIG. 1 showing the scanning of samples with an electron beam, indicated by 1 is a sample of an electrical insulation substance, 2 is a sample of a conductive substance, 3 is an electron beam. When the electron beam 3 makes a scanning across the samples from left to right, it produces a secondary electron signal waveform 4 having different shapes for the left edge K (beginning of scanning) and the right edge L (end of scanning) of the sample 1, due to the potential difference attributable to the difference of charges on the surface of the sample 1.

Figure 3:
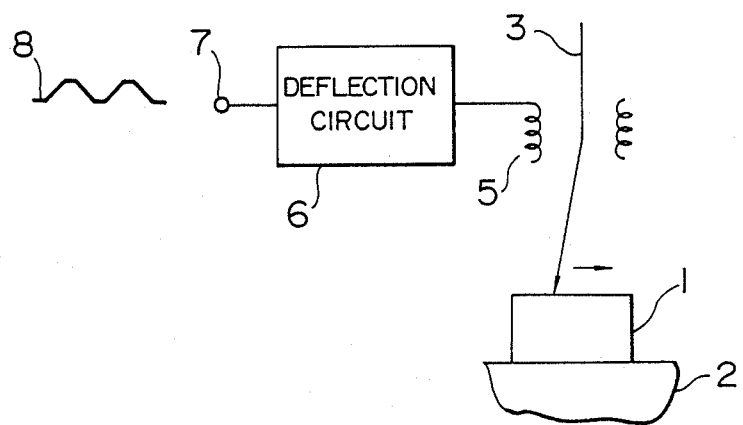
FIG. 3 is a diagram showing in brief the inventive electron beam deflection system in which a deflection circuit is used to implement the electron beam scanning.

In FIG. 3, the electron beam 3 scans the samples 1 and 2 by being deflected with a deflection coil 5 which is driven by a deflection circuit 6. In order for the electron beam 3 to scan the samples in the same condition for both scanning directions, a scanning signal as shown in the figure is applied to the input terminal 7 of the deflection circuit 6. In scanning electron micrography, a lower electron acceleration voltage (1000 volts approx.) is used for the sake of reducing the influence of charging to the sample, as has been mentioned previously. However, an electron beam exerted with a lower acceleration voltage is prone to deflection by an external magnetic field. Particularly, when an electron beam is deflected under the influence of an external a.c. magnetic field created by an external a.c. power supply facility or a.c. power lines, the beam has its scanning position on the sample deviated from the inherent position determined by the deflection circuit, resulting in an inaccurate positioning of the beam spot.

In order to be rid of the above impropriety, there is known an effective method of preventing the electron beam from deviating from the inherent scanning position in each scanning period by making the deflection scanning signal to have its phase coincident (synchronous scanning) with the phase of the SEM a.c. power supply or external a.c. magnetic field.

Figure 4:
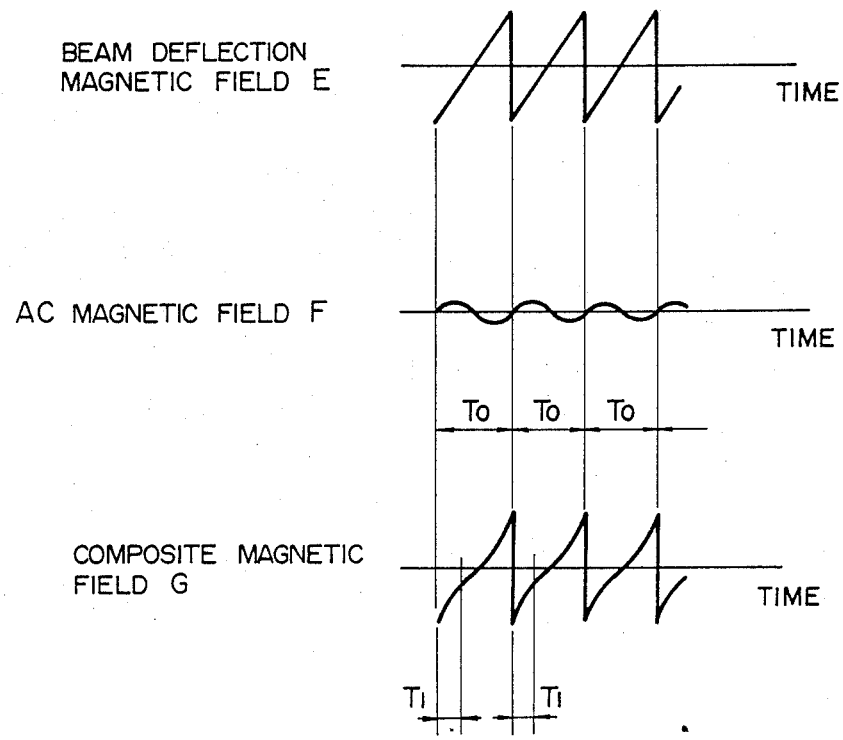
FIG. 4 is a waveform diagram used to explain the conventional synchronous scanning operation.

The principle of synchronous scanning will be described with reference to FIG. 4, in which scanning in only one direction is shown. In the figure, shown by E is a beam deflection magnetic field produced by the deflection circuit 6, F is an external magnetic field, and G is a composite deflection magnetic field resulting from the superimposition of F on E. The composite magnetic field G has a unique magnitude in the same phase T1 in each period To. This synchronous scanning enables the electron beam to scan a sample constantly without varying the scanning position in each scanning period To.

Figure 2:
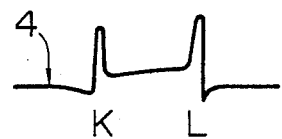
FIG. 2 is a graph showing the secondary electron signal waveform produced by the conventional scanning manner shown in FIG. 1.

While the foregoing synchronous scanning can eliminate the adverse effect of an external a.c. magnetic field, the inventors of the present invention have revealed the fact that an insulation sample scanned by an electron beam of a lower acceleration voltage creates a potential difference in portions at the beginning and end of scanning even if the sample has a symmetric shape. This potential difference produces an asymmetric waveform of the secondary electron signal as shown in FIG. 2, resulting in an erroneous observation appearing as if the sample shape is asymmetric.

The present invention is intended to reduce significantly the difference of potential at both sides of a sample by scanning the sample with an electron beam in one direction and than the other direction, i.e. in the right-to-left and left-to-right directions alternately, thereby producing a secondary electron signal waveform with satisfactory fidelity in the symmetry of sample.

Figure 5:
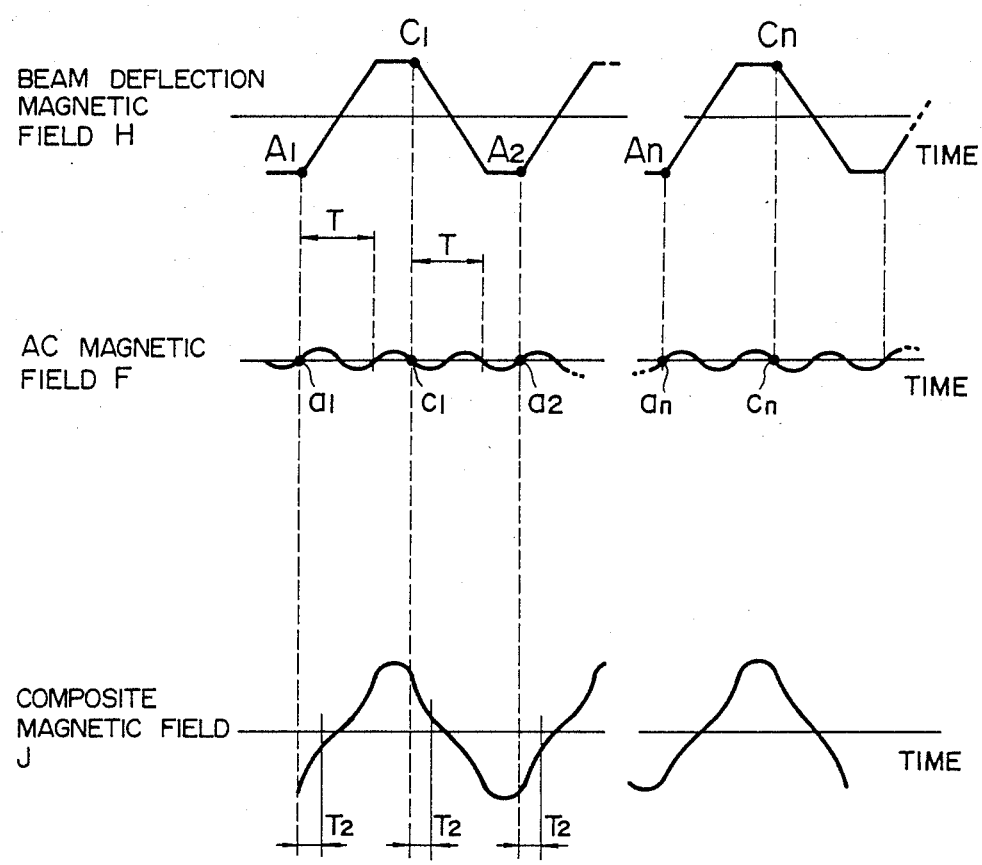
FIG. 5 is a waveform diagram used to explain the reciprocative electron beam scanning operation embodying the present invention.

In FIG. 5, shown by H is a beam deflection magnetic field produced by the deflection circuit 6, F is an external a.c. magnetic field, and J is a composite magnetic field for deflecting the electron beam resulting from the superimposition of F on H. The deflection magnetic field H has its scanning start phases A1-An for one scanning direction and those C1-Cn for another scanning direction synchronized with zero-cross points a1-an and c1-cn of the a.c. magnetic field F.

The present invention features the time difference between Cn and An selected not equal to the time length of one period (T) or a multiple of period (mT), but equal to one period (T) or a multiple of period (mT) plus a half period (T/2), i.e., T+T/2 or mT+T/2. This scheme allows the composite magnetic field J to have the same magnitude at the same phase of each period, whereby the electron beam has an invariable scanning position over scanning cycles.

Figure 6:
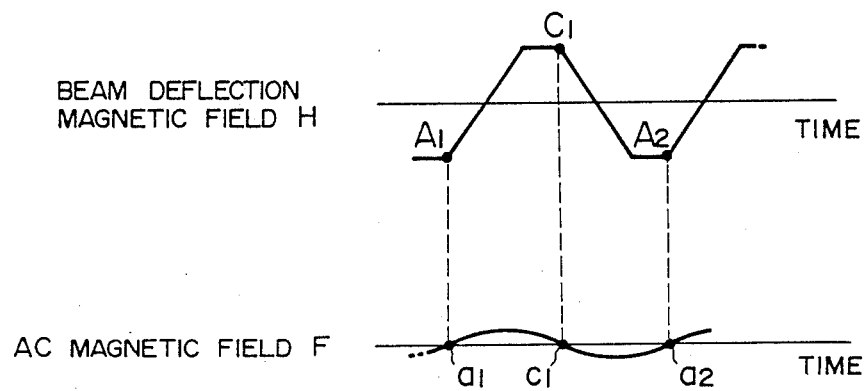
FIG. 6 is a waveform diagram used to explain another embodiment of this invention.

FIG. 6 shows another embodiment of this invention, in which the time difference between a scanning start phase An (Cn) of the deflection magnetic field H and a corresponding zero-cross point $a_n$ ($c_n$) of a.c. magnetic field F for one (or another) scanning direction is set to a half period. Making the time difference smaller is advantageous in speeding up the scanning operation as compared with the case of a greater time difference as shown in FIG. 5, with a time difference of 1.5 periods.

As described above, the present invention significantly alleviates the influence of differential charging in observing the shape of an insulation sample, whereby the accuracy of measuring the shape and dimensions of samples is enhanced.

I claim:

1. A scanning electron microscope comprising means for generating a magnetic field for deflecting an electron beam, said means for receiving a scanning signal which operates on said electron beam to scan a sample having electrical characteristics approximating those of an insulator in one direction and another direction opposite to said direction alternately in a reciprocative fashion, with a time difference of n period(s) (where n=0, 1, 2, . . . ) plus a half period of a.c. power being provided between a scanning start time point in each scanning direction of said deflection magnetic field and a corresponding zerocross time point of said a.c. power.

2. A scanning electron microscope according to claim 1, wherein said deflection magnetic field generation means comprises a deflection circuit which generates a deflection current and a deflection coil which produces said deflection magnetic field by being supplied with said deflection current.

3. A scanning electron microscope comprising means for generating a magnetic field for deflecting an electron beam, said means receiving a scanning signal which operates on said electron beam to scan an electrical insulation sample in one direction and another direction opposite to said direction alternately in a reciprocative fashion, with a time difference of n period(s) (where n=0, 1, 2, . . . plus a half period of an external a.c. magnetic field being provided between a scanning start time point in each scanning direction of said deflection magnetic field and a corresponding zero-cross time point of said external a.c. magnetic field.

4. A scanning electron microscope according to claim 3, wherein said deflection magnetic field generation means comprises a deflection circuit which generates a deflection current and a deflection coil which produces a deflection magnetic field by being supplied with said deflection current.

5. An electron beam scanning method comprising the steps of generating a magnetic field for deflecting an electron beam, and scanning a sample having electrical characteristics approximating those of an insulator with said electron beam in one direction and another direction opposite to said direction alternately in a reciprocative fashion in response to a scanning signal, with a time difference of n period(s) (where n=0, 1, 2, . . . ) plus a half period of a.c. power being provided between a scanning start time point in each scanning direction of said deflection magnetic field and a corresponding zero-cross time point of said a.c. power.

6. An electron beam scanning method according to claim 5, wherein said deflection magnetic field generation step comprises a step of generating a deflection current and a step of producing said deflection magnetic field by being supplied with said deflection current.

7. An electron beam scanning method comprising the steps of generating a magnetic field for deflecting an electron beam, and scanning a sample having electrical characteristics approximating those of an insulator with said electron beam in one direction and another direction opposite to said direction alternately in a reciprocative fashion in response to a scanning signal, with a time difference of n period(s) (where n=0, 1, 2, . . . ) plus a half period of an external a.c. magnetic field being provided between a scanning start time point in each scanning direction of said deflection magnetic field and a corresponding zero-cross time point of said external a.c. magnetic field.

8. An electron beam scanning method according to claim 7, wherein said deflection magnetic field generation step comprises a step of generating a deflection current and a step of producing said deflection magnetic field by being supplied with said deflection current.

* * * * *